United States Patent
Doi et al.

(10) Patent No.: US 6,870,125 B2
(45) Date of Patent: Mar. 22, 2005

(54) CRYSTAL LAYER SEPARATION METHOD, LASER IRRADIATION METHOD AND METHOD OF FABRICATING DEVICES USING THE SAME

(75) Inventors: Masato Doi, Kanagawa (JP); Toshiaki Iwafuchi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 50 days.

(21) Appl. No.: 10/308,935

(22) Filed: Dec. 3, 2002

(65) Prior Publication Data

US 2003/0150843 A1 Aug. 14, 2003

(30) Foreign Application Priority Data

Dec. 3, 2001 (JP) .......................................... 2001-368468

(51) Int. Cl.[7] .............................................. B23K 26/00
(52) U.S. Cl. ................................ 219/121.6; 219/121.85
(58) Field of Search .......................... 219/121.6, 121.85; 438/46, 458

(56) References Cited

U.S. PATENT DOCUMENTS 6,420,242 B1 * 7/2002 Cheung et al. ............. 438/458
6,448,102 B1 * 9/2002 Kneissl et al. .............. 438/46
6,562,648 B1 * 5/2003 Wong et al. ................. 438/46

FOREIGN PATENT DOCUMENTS

| JP | 04-182093 | 6/1992 |
| JP | 2000-101139 | 4/2000 |

* cited by examiner

Primary Examiner—M. Alexandra Elve
(74) Attorney, Agent, or Firm—Wolf, Greenfield & Sacks, P.C.

(57) ABSTRACT

Disclosed are a crystal layer separation method capable of separating a crystal layer formed on a substrate therefrom without occurrence of any crack, and a laser irradiation method used therefor, and a method of fabricating devices using the same. The crystal layer separation method includes the step of separating a crystal layer made from a GaN based compound formed on a sapphire substrate therefrom by irradiating the crystal layer with a laser beam from the back surface of the substrate, wherein the crystal layer is irradiated with the laser beam in a line-shape. In this method, an irradiation width of the laser beam is preferably equal to or less than a thickness of the crystal layer, and the laser beam preferably has a light intensity distribution smoothened in the width direction.

20 Claims, 12 Drawing Sheets

F I G. 1
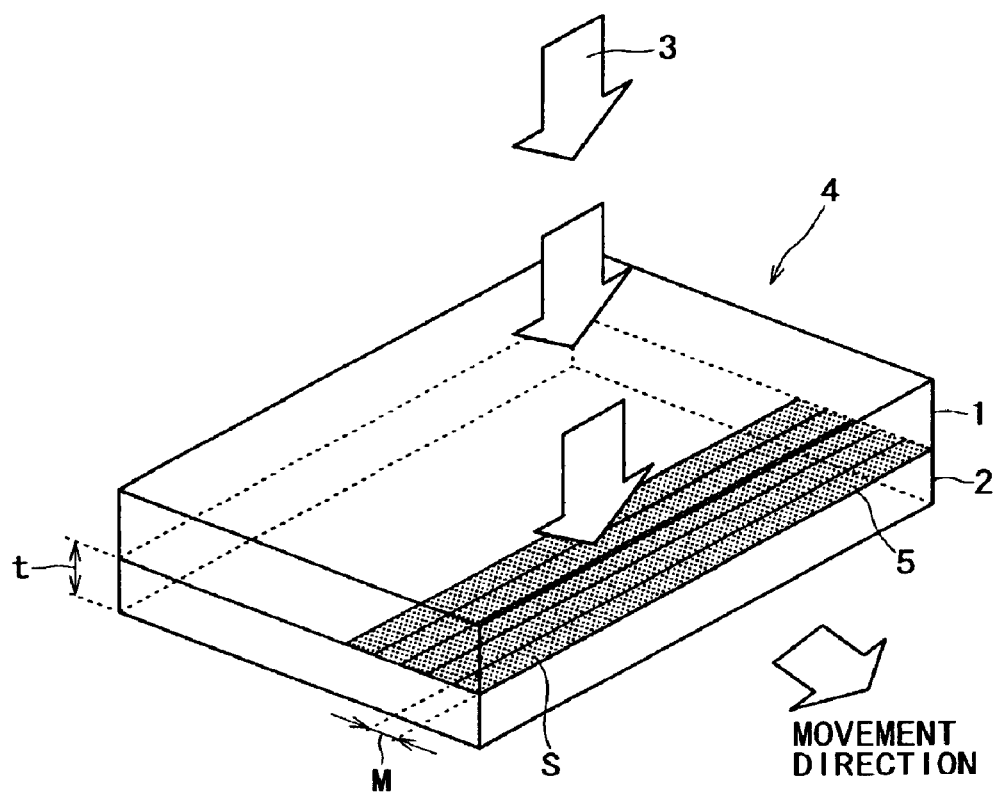

F I G. 2
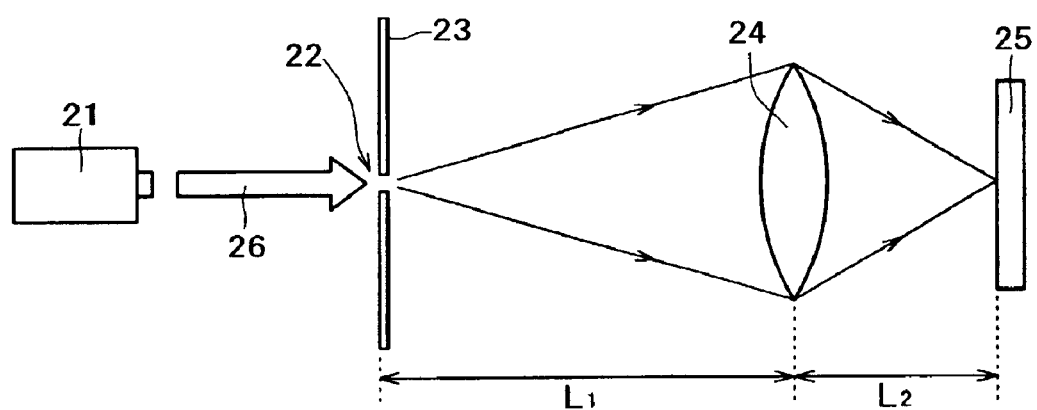
F I G. 3 A
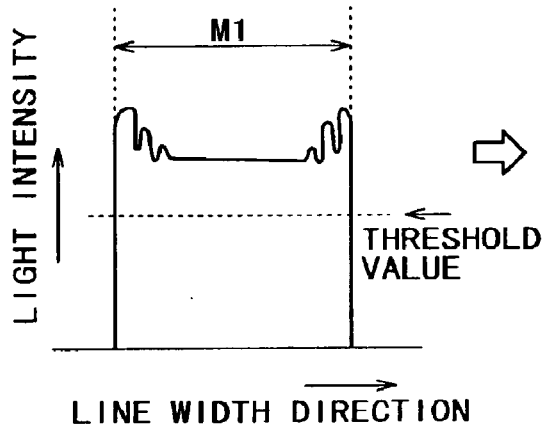
F I G. 3 B
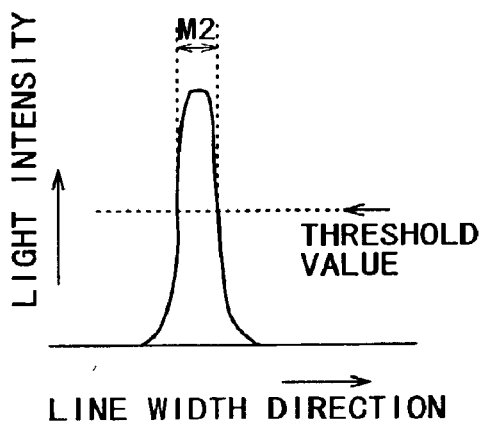

LINE BEAM SIZE:W10μm/L2.0mm
SCAN PICTCH:2μm/PULSE
LASER:KrF 400mJ,m=3,160pps

LINE BEAM SIZE:W20μm/L2.0mm
SCAN PICTCH:16μm/PULSE
LASER:KrF 400mJ,m=3,20pps

F I G. 7
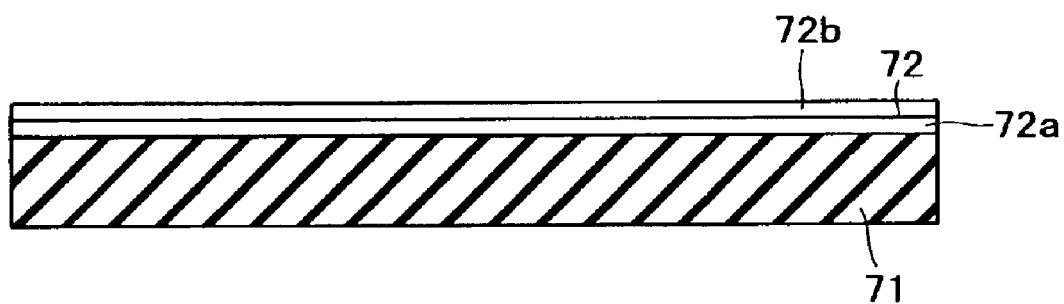
F I G. 8
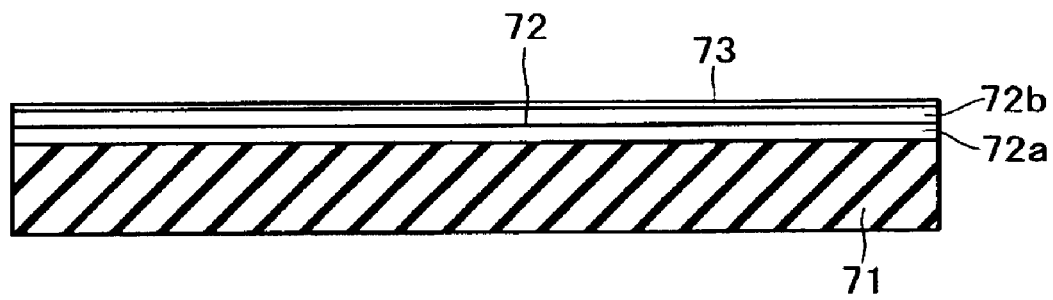

F I G. 1 1
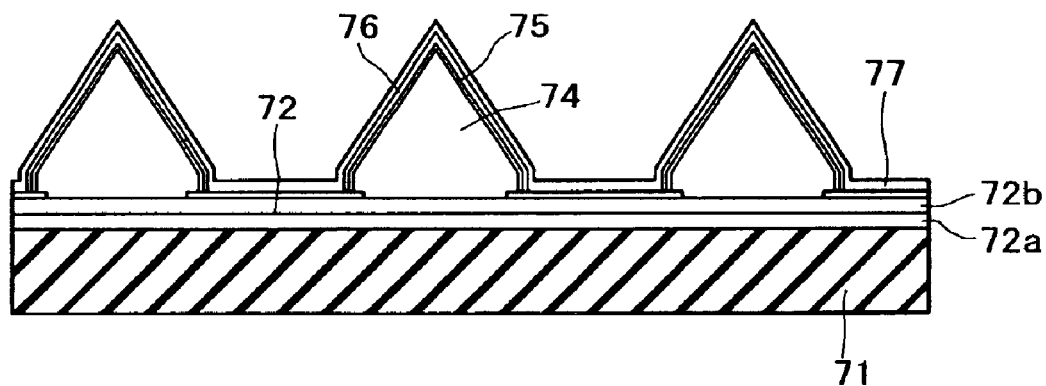
F I G. 1 2
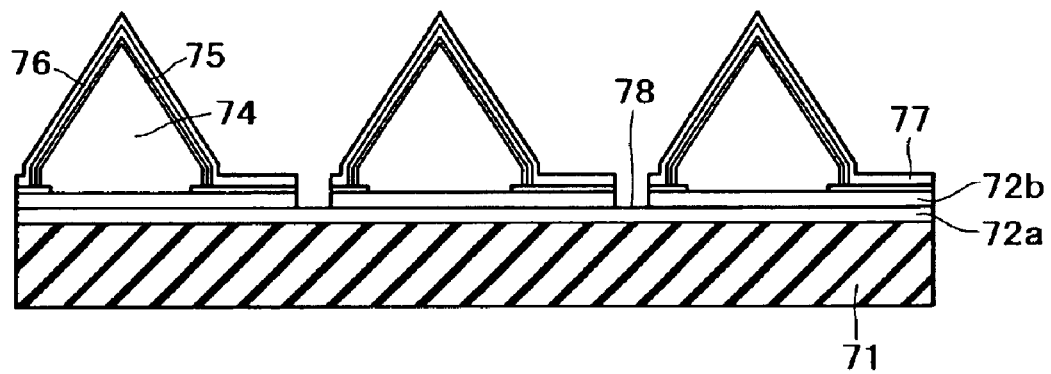

F I G. 1 5
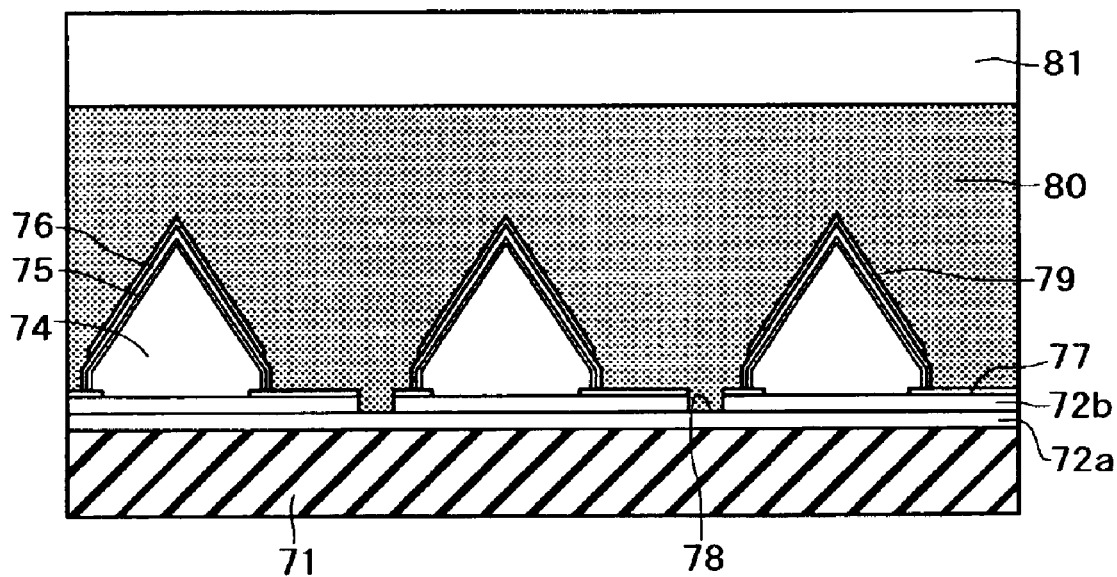
F I G. 1 6
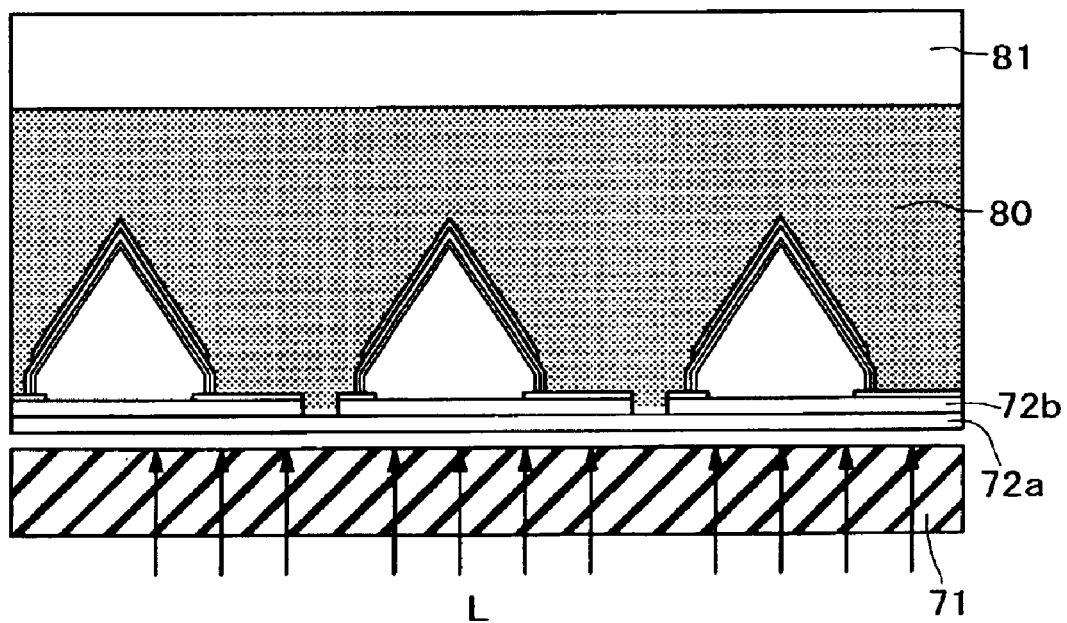

F I G. 1 7
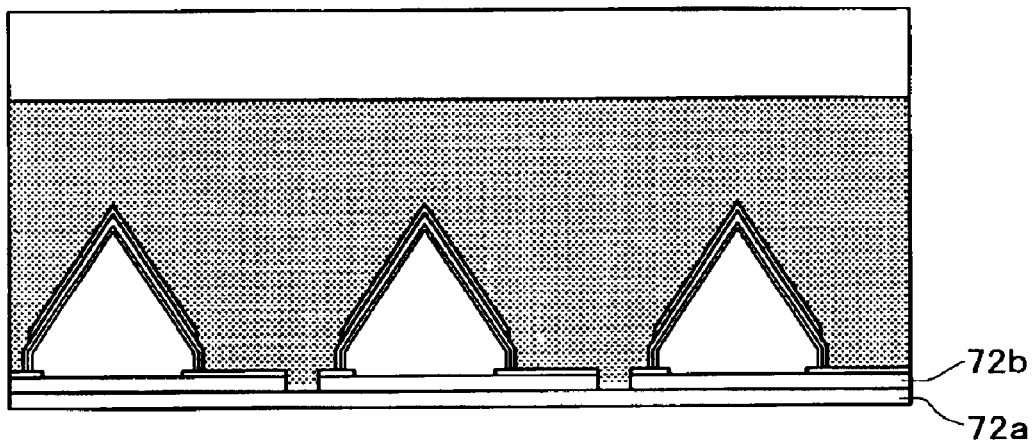
F I G. 1 8
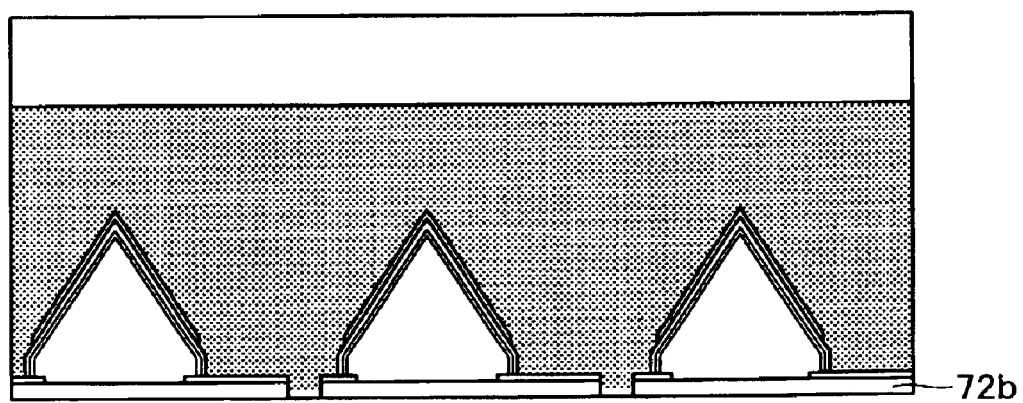

CRYSTAL LAYER SEPARATION METHOD, LASER IRRADIATION METHOD AND METHOD OF FABRICATING DEVICES USING THE SAME

BACKGROUND OF THE INVENTION

The present invention relates to a crystal layer separation method, a laser irradiation method used therefor, and a method of fabricating devices using the same. In particular, the present invention relates to a method of separating a crystal layer from a substrate by irradiating the interface therebetween with a laser beam in a line-shape, and a laser irradiation method used therefor, and a method of fabricating devices using the same.

With respect to a process of fabricating semiconductor light emitting devices by using GaN based compound semiconductors, there has been known a technique of separating a crystal layer made from a GaN based compound formed on a sapphire substrate from the sapphire substrate by irradiating the interface therebetween with a laser beam from the back surface of the sapphire substrate.

For example, Japanese Patent Laid-open No. 2000-101139 has disclosed a technique of forming a GaN layer on a sapphire substrate, and irradiating the interface between the GaN layer and the sapphire substrate with a laser beam from the back surface of the sapphire substrate, to partially decompose GaN forming the GaN layer, thereby separating the GaN layer from the sapphire substrate. This technique, however, teaches only the irradiation density of the laser beam and the laser beam having a wavelength liable to be absorbed in the GaN layer.

To efficiently separate a crystal layer made from a GaN based compound from a sapphire substrate, there has been also proposed a technique of enlarging an area of the laser beam per one shot, and sequentially irradiating the interface between the sapphire substrate and the crystal layer with the laser beam, thereby separating the crystal layer from the sapphire substrate with a high throughput.

By the way, to separate a crystal layer made from a GaN based compound formed on a sapphire substrate therefrom by irradiating the interface between the sapphire substrate and the crystal layer with a laser beam from the back surface of the sapphire substrate, it is important to project a laser beam having an irradiation energy equal to or more than a threshold value required for decomposing the GaN based compound into Ga and $N_2$. On the other hand, at the time of laser irradiation, the decomposition of GaN results in generation of $N_2$ gas. The $N_2$ gas is expanded, to give a shear stress to the GaN layer, thereby tending to cause cracks at a boundary among irradiation regions irradiated with the laser beam. For example, as shown in FIG. 20, if each of the irradiation regions, which are denoted by reference numerals 201 in the figure, has a square shape, a crack 202 may occur at the boundary among the irradiation regions.

In particular, in the case of fabricating devices on a crystal layer made from a GaN based compound having a thickness of several $\mu$m or less, the strength of the crystal layer may become insufficient against a shear stress caused by generation of $N_2$ gas, whereby cracks easily occur in the crystal layer. In this case, the cracks occurring in the crystal layer made from a GaN based compound may be propagated to another crystal layer stacked thereon, and at the worst case, devices formed on the crystal layer made from a GaN based compound be broken. Such a problem becomes significant in the case of forming micro-sized devices. If cracks may occur in devices, the devices fail to exhibit specific performances, thereby lowering the yield of devices formed by separating the devices from a substrate by laser ablation.

SUMMARY OF THE INVENTION

An object of the present invention is to provide a crystal layer separation method capable of separating a crystal layer formed on a substrate therefrom without occurrence of any crack, and a laser irradiation method used therefor, and a method of fabricating devices using the same.

To achieve the above object, according to a first aspect of the present invention, there is provided a crystal layer separation method including the step of separating a crystal layer formed on a substrate from the substrate by irradiating the crystal layer with light, wherein the crystal layer is irradiated with the light in a line-shape. Since the crystal layer is irradiation with the light in a line-shape, a stress caused at the time of light irradiation is relieved. At this time, the irradiation width of the light may be set to a value equal to or less than the thickness of the crystal layer. With this configuration, it is possible to separate the crystal layer from the substrate without occurrence of any crack.

According to a second aspect of the present invention, there is provided a laser beam irradiation method including the step of irradiating a target with a laser beam in a line-shape, wherein the laser beam has a smooth light intensity distribution. Since a crystal layer is irradiated with the laser beam having a smooth light intensity distribution, it is possible to suppress rapid decomposition of the crystal layer at a boundary among irradiation regions irradiated with the laser beam, and hence to reduce occurrence of cracks.

According to a third aspect of the present invention, there is provided a device fabrication method including the step of irradiating a crystal layer formed on a substrate with light in a line-shape, thereby separating the crystal layer from the substrate. At this time, the irradiation width of the light may be set to a value equal to or less than the thickness of the crystal layer. With this configuration, it is possible to prevent breakage of the devices at the time of separating the crystal layer from the substrate, and hence to desirably form the devices.

BRIEF DESCRIPTION OF THE DRAWINGS

Other features and advantages of the present invention will be apparent from the following description taken in conjunction with the accompanying drawings wherein:

FIG. 1 is a schematic view showing a laser irradiation step in a crystal layer separation method of the present invention;

FIG. 2 is a conceptual view of laser irradiation in a laser irradiation method of the present invention;

FIG. 3A is a diagram showing a light intensity distribution of a laser beam according to a related art laser irradiation method, and FIG. 3B is a diagram showing a light intensity distribution of a laser beam according to the laser irradiation method of the present invention;

FIGS. 6A and 6B are microphotographs comparatively showing crack generation states of the sample in the experiment for examining the effect of the crystal layer separation method of the present invention, wherein FIG. 6A shows the crack generation state of the sample irradiated with a laser beam having a width being not sufficiently reduced, and FIG. 6B shows the crack generation state of the sample irradiated with a laser beam having a width being sufficiently reduced;

FIG. 7 is a sectional view showing a step of forming a first growth layer on a growth substrate in one embodiment of a method of fabricating devices according to the present invention;

FIG. 8 is a sectional view showing a step of forming an anti-growth film in the embodiment of the method of fabricating devices according to the present invention;

FIG. 11 is a sectional view showing a step of forming a protective film in the embodiment of the method of fabricating devices according to the present invention;

FIG. 12 is a sectional view showing a step of forming device isolation grooves in the embodiment of the method of fabricating devices according to the present invention;

FIG. 15 is a sectional view showing a step of fixing devices on a temporarily holding substrate in the embodiment of the method of fabricating devices according to the present invention;

FIG. 16 is a sectional view showing a step of separating the whole crystal growth layer from the growth substrate by laser irradiation in the embodiment of the method of fabricating devices according to the present invention;

FIG. 17 is a sectional view showing the state after the whole crystal growth layer is separated from the growth substrate in the embodiment of the method of fabricating devices according to the present invention;

FIG. 18 is a sectional view showing a step of removing a first growth layer in the embodiment of the method of fabricating devices according to the present invention;

DETAILED DESCRIPTION OF THE PREFERRED EMBODIMENTS

Figure 4:
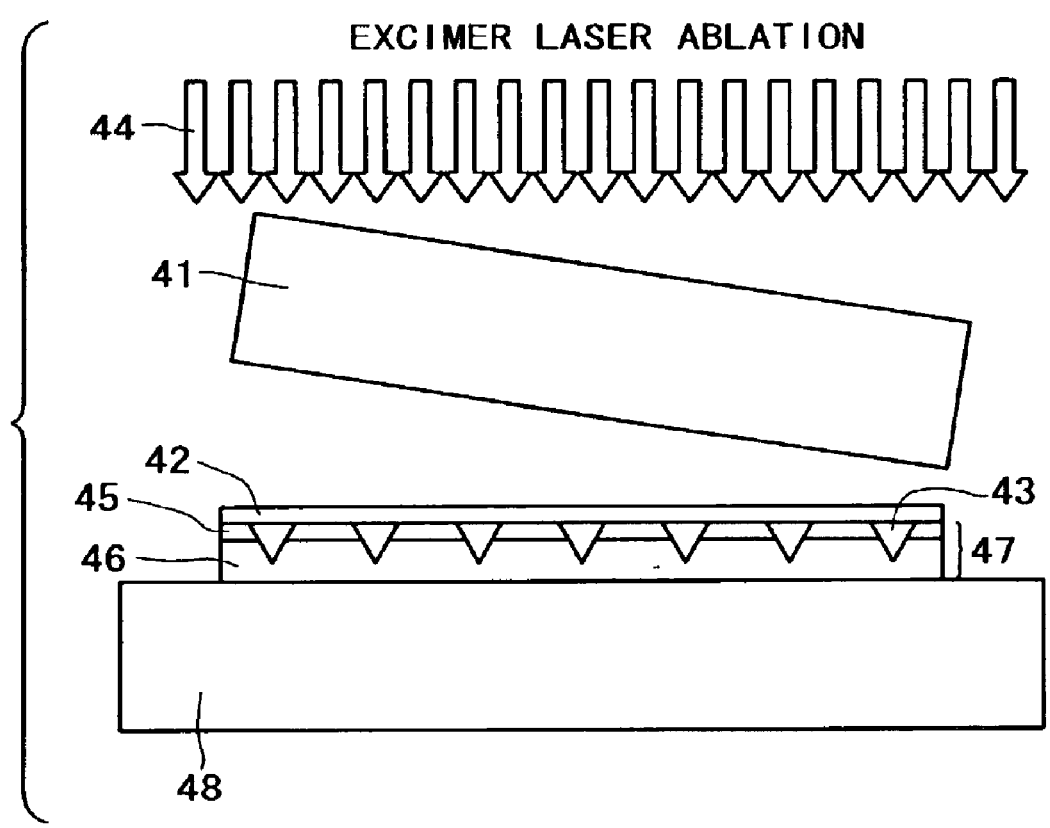
FIG. 4 is a sectional view of a sample in an experiment for examining the effect of the crystal layer separation method of the present invention.

A method of separating a crystal layer formed on a substrate therefrom by laser irradiation, a laser irradiation method therefor, and a method of fabricating devices by using the same according to the present invention will be hereinafter described with reference to the drawings. First, an embodiment of the crystal layer separation method according to the present invention will be described. This embodiment is basically characterized in that a crystal layer formed on a substrate is irradiated with a line-shaped beam, to be separated therefrom.

FIG. 1 is a schematic view illustrating steps of separating a crystal layer formed on a substrate therefrom by laser irradiation. Referring to FIG. 1, there is shown a substrate 1 made from sapphire, on the surface of which a crystal layer 2 of a GaN based compound has been already formed. The crystal layer 2 may be formed by a vapor-phase growth process, examples of which include an MOCVD (Metalorganic Chemical Vapor deposition) or MOVPE (Metalorganic Vapor Phase Epitaxy) process, an MBE (Molecular Beam Epitaxy) process, and an HVPE (Hydride Vapor Phase Epitaxy) process. In particular, the MOCVD process is preferable because it allows rapid formation of the crystal layer 2 with good crystallinity. In the case of adopting the MOCVD process for forming the crystal layer 2 made from a GaN based compound, an alkyl-metal compound such as TMG (trimethyl gallium) or TEG (triethyl gallium) is used as a gallium (Ga) source, and a gas such as ammonia or hydrazine is used as a nitrogen (N) source. If the crystal layer 2 is required to function as that having an n-type or a p-type conductivity, it may be doped with Si or Mg. The crystal layer 2 has a thickness required for formation of micro-sized devices thereon, which thickness is exemplified by 3 $\mu$M. In addition, a crystal layer and an electrode layer for constituting parts of devices may be formed on the crystal layer 2, and further, a plurality of crystal layers may be formed on the crystal layer 2.

The substrate 1 may be made from any material insofar as it allows desirable formation of the crystal layer 2 of a GaN based compound thereon and also allows a laser beam having a wavelength suitable for decomposition of the GaN based compound of the crystal layer 2 (to be described later) to pass therethrough. According to this embodiment, particularly, to desirably grow the crystal layer 2 made from a GaN based compound on the substrate 1, a sapphire substrate with a C-plane of sapphire taken as the principal plane of the substrate is used as the substrate 1.

With respect to laser irradiation, an interface between the substrate 1 and the crystal layer 2 is irradiated with a laser beam 3 traveling from the back surface of the substrate 1 in such a manner that a line-shaped irradiation region S is formed at the interface therebetween. To form such a line-shaped irradiation region S, according to this embodiment, a line-shaped laser beam is used as the laser beam 3. To be more specific, a laser beam emitted from a light source is shaped into a line-shaped laser beam 3 having a specific light intensity distribution by beam shaping performed in an optical system, and the line-shaped laser beam 3 is directed to the back surface of the substrate 1 for irradiating the interface between the substrate 1 and the crystal layer 2. From the viewpoint of desirable separation of the crystal layer 2 made from a GaN based compound from the sapphire substrate 1, a KrF excimer laser beam is preferably used as the laser beam 3, although any other laser beam may be used insofar as it can separate the crystal layer 2 from the sapphire substrate 1 by decomposing gallium nitride (GaN) of the GaN based compound, at the interface between the substrate 1 and the crystal layer 2, of the crystal layer 2.

The crystal layer separation method according to the present invention will be described in more detail below. As shown in FIG. 1, the line-shaped laser beam 3, which has been shaped by the optical system as described above, is projected to a stacked body 4 including the substrate 1 and the crystal layer 2 from the back surface of the substrate 1. At this time, the laser beam 3 is projected as a pulse beam having a frequency of, for example, about 200 Hz. The stacked body 4 is formed into a stripe shape which has, for example, a length (in the longitudinal direction) of 0.6 mm to 1.0 mm and a width of about 7.5 μm. With respect to the length of the stacked body 4, however, since the irradiation area per one shot of the line-shaped laser beam 3 becomes larger as the length of the stacked body 4 becomes longer, the length of the stacked body 4 is preferably set in a range of 20 mm to 30 mm. In addition, the thickness "t" of the crystal layer 2 is typically set to about 3 μM.

The stacked body 4 is moved in the direction perpendicular to the longitudinal direction of the line-shaped projection of the laser beam 3. As a result, the line-shaped laser beam 3 is sequentially projected to the stacked body 4 in the width direction from a side edge portion 5, to finally irradiate the whole interface between the substrate 1 and the crystal layer 2. It is to be noted that the irradiation of the laser beam 3 is made by moving the stacked body 4 while fixing the optical system of the laser beam 3 in this embodiment; however, the irradiation of the laser beam 3 may be made by moving the optical system of the laser beam 3 while fixing the stacked body 4.

The width M of the irradiation region S per one shot of the laser beam 3 is set to be nearly equal to or less than the thickness "t" of the crystal layer 2. The irradiation width M is determined by the line width of the line-shaped laser beam 3, the pulse interval of the laser beam 3, and the movement speed of the stacked body 4. If the thickness "t" of the crystal layer 2 to be separated from the substrate 1 is smaller than the line width of the laser beam 3, the movement speed of the stacked body 4 is adjusted such that the width M of an irradiation region to be formed by the next shot of the laser beam 3 becomes nearly equal to or less than the thickness "t" of the crystal layer 2. For example, if the thickness "t" of the crystal layer 2 is 3 μm, the irradiation width M may be set to about 0.8 μm. In this case, part of the irradiation region, which has been formed by the previous shot of the laser beam 3, is overlappedly irradiated with the next shot of the laser beam 3. In this way, by optimizing the pulse interval of the laser beam 3 and the movement speed of the stacked body 4, the line-shaped irradiation regions S are sequentially formed such that the adjacent two thereof are partially overlapped to each other. As a result, even if the line width of the laser beam 3 is larger than the thickness "t" of the crystal layer 2, the irradiation width M can be set to be nearly equal to or less than the thickness "t" of the crystal layer 2.

The material of the crystal layer 2 is partially decomposed at the interface between the substrate 1 and the crystal layer 2 by irradiating the interface with the laser beam 3, to release the bonding between the substrate 1 and the crystal layer 2, thereby allowing the crystal layer 2 to be easily separated from the substrate 1 by mechanical means such as chucking. In particular, if the crystal layer 2 is made from a GaN based compound as in this embodiment, gallium nitride (GaN) of the GaN based compound, at the interface between the substrate 1 and the crystal layer 2, of the crystal layer 2 is decomposed into gallium (Ga) and nitrogen (N) by irradiating the interface with the laser beam 3. At this time, the decomposed gallium is accumulated near the interface between the substrate 1 and the crystal layer 2; however, since the melting point of gallium is about 30° C., the adhesive force between the substrate 1 and the crystal layer 2 can be lowered by heating the irradiated stacked body 4 by means of a hot plate or the like, with a result that the crystal layer 2 can be easily separated from the substrate 1. In addition, $N_2$ gas is generated together with the decomposed gallium; however, in the case of sequentially projecting the line-shaped laser beam 3 to the stacked body 4 in the direction perpendicular to the longitudinal direction of the line-shaped projection of the laser beam 3, since the $N_2$ gas is discharged to the already irradiated region at which the bonding force between the substrate 1 and the crystal layer 2 has been lowered, an excess stress is not applied to the crystal layer 2 by the effect of generation of the $N_2$ gas.

An embodiment of the laser irradiation method used for the above-described crystal layer separation method will be described below with reference to FIGS. 2 to 3B. The laser beam used for separation of the crystal layer 2 from the substrate 1 is generally shaped into a line-pattern as described above, and according to this embodiment, the line-shaped laser beam is particularly specified such that a light intensity distribution thereof in the direction (line width direction) perpendicular to the longitudinal direction of the line-shaped laser beam becomes smooth. FIG. 2 is a conceptual view of an optical system used in this embodiment for shaping a laser beam into a line-pattern and projecting the line-shaped laser beam to a sample, and FIGS. 3A and 3B are diagrams illustrating a light intensity distribution of the laser beam after beam shaping (FIG. 3B) in comparison with a light intensity distribution of the laser beam before beam shaping (FIG. 3A).

Referring to FIG. 2, there is shown an optical system including a light source 21 for generating a laser beam, a pattern mask 23 having a slit 22 for beam shaping, and a convex lens 24. A laser beam 26 is emitted from the light source 21. In the case of processing a micro-sized region by irradiating the region with a laser beam, particularly, in the case where the resolution of the irradiation region by the laser beam is required to be in an order of μm is required, since the resolution of the irradiation region by the laser beam becomes higher as the wavelength of the laser beam becomes shorter, an excimer laser beam having a wavelength in an ultraviolet region is generally used. For this reason, an excimer laser beam such as a KrF excimer laser or an ArF excimer laser beam is used as the laser beam 26. The laser beam 26 is made to pass through the slit 22 of the pattern mask 23 for beam shaping, to be shaped into a line-pattern longer in the direction perpendicular to the optical axis of the laser beam 26.

The laser beam 26 thus shaped into a line-pattern via the slit 22 of the pattern mask 23 is projected to a sample 25 through the convex lens 24. Here, letting a distance between the slit 22 and the convex lens 24 be $L_1$ and a distance between the convex lens 24 and the sample 25 be $L_2 (<L_1)$, the laser beam 26 incident on the convex lens 24 is reduction-projected to the sample 25 at a reduction ratio of $(L_2/L_1)$. With respect to the line width of the laser beam 26, since the resolution R of the irradiation region by the laser beam 26 is determined by an equation of $R = K \cdot (\lambda/N.A)$ [K: constant, λ: wavelength of laser beam, N.A: numeral aperture of convex lens], the laser beam 26 can be reduction-projected such that the line width thereof is reduced into a value being equal to or less than the resolution R determined by the above equation, for example, about several μm by setting the numeral aperture of the convex lens 24 to about 0.1. In addition, a homogenizer for shaping the laser beam 26 into a line-pattern may be disposed between the light source 21 and the slit 22.

As described above, when the laser beam 26 is reduction-projected at the reduction ratio $L_2/L_1$ on the surface of the sample 25 via the convex lens 24 disposed as shown in FIG. 2, the line width of the laser beam 26 becomes equal to or less than the resolution R. In this case, since the line width of the laser beam 26 is equal to or less than the resolution R, the light intensity distribution of the laser beam 26 in the line width direction is specified such that the light intensity is smoothly changed from the peak portion to an edge portion as shown in FIG. 3B (to be described later). Accordingly, if the sample 25 is a stacked body composed of a sapphire substrate and a crystal layer made from a GaN based compound on the sapphire substrate, the laser beam 26 is reduction-projected to the stacked body in such a manner as to form, at the interface between the sapphire substrate and the crystal layer, an irradiation region irradiated with the laser beam 26 having the light intensity equal to or more than a threshold value required for decomposing the GaN based compound of the crystal layer, whereby the crystal layer of the GaN based compound is separated from the sapphire substrate at the interface therebetween, that is, in the irradiation region of the laser beam 26. In this case, since the irradiation region is formed by the reduction-projected laser beam 26 having the smooth light intensity from the peak portion to the edge portion, it is possible to suppress rapid generation of $N_2$ gas at the edge portion of the irradiation region, and hence to prevent an excess stress from being applied to the crystal later. This makes it possible to reduce the occurrence of cracks in the crystal layer at the edge portion of the irradiation region formed by the line-shaped laser beam 26 at the interface between the sapphire substrate and the crystal layer.

FIGS. 3A and 3B are diagrams illustrating the light intensity distributions of the laser beam in the line width direction before and after beam shaping, respectively. The term "line width direction" of the laser beam means the direction parallel to the width M of an irradiation region to be formed by laser irradiation, that is, parallel to the movement direction of the stacked body 4. FIG. 3A shows the light intensity distribution of the laser beam shaped into an approximately rectangular shape having a line width M1 larger than the resolution determined by the optical system for projecting the laser beam. In a central area of the laser beam having the line width M1, the light intensity thereof is flattened, while at an edge portion of the laser beam, the light intensity thereof is uneven because of over-interference of the laser beam. If the light intensity varied in a wavy form at the edge portion of the laser beam exceeds the threshold value for decomposing the GaN based compound of the crystal layer by laser irradiation, decomposition of the GaN based compound of the crystal layer occurs rapidly at an edge portion of the irradiation region, which is irradiated with the edge portion of the laser beam as compared with that in a central area of the irradiation region, which is irradiated with the central area, having the flattened intensity, of the laser beam. The irradiation region has the two edge portions, that is, the front edge portion (right edge portion in FIG. 3A) and the rear edge portion (left edge portion in FIG. 3A) in the line width direction parallel to the movement direction of the stacked body. During continuous laser irradiation, when the front edge portion is irradiated with the laser beam, to start decomposition of the GaN based compound of the crystal layer, thereby weakening the bonding force between the substrate and the crystal layer, the rear edge portion remains as being not irradiated with the laser beam, and thereby the bonding force between the substrate and the crystal layer at the rear edge portion is kept as it is. Accordingly, when $N_2$ gas is rapidly generated at the front edge portion by laser irradiation, a stress caused by expansion of the $N_2$ gas is directly propagated to the rear edge portion not irradiated with the laser beam, so that an excess stress is applied to the crystal layer at the rear edge portion not irradiated with the laser beam. As a result, if the crystal layer has a thickness of several $\mu$m, since the strength of the crystal layer is low, cracks tend to occur in the crystal layer at the rear edge portion not irradiated with the laser beam.

To cope with such an inconvenience, according to this embodiment, as shown in FIG. 3B, the line width of the laser beam is set to a value M equal to or less than the resolution of the optical system for use in laser irradiation, to thereby the unevenness of the light intensity distribution of the laser beam due to over-interference thereof. More specifically, as shown in FIG. 3B, the light intensity distribution of the laser beam having the line width M2 is characterized in that the light intensity of the laser beam is smoothly changed from the peak value, which is present at an approximately central portion, to an edge portion. As another feature of this embodiment, if the thickness of the crystal layer to be separated from the substrate is in the order of several $\mu$m, the line width M2 of the laser beam is set to a value equal to or less than the thickness of the crystal layer. With this configuration, it is possible to suppress rapid generation of $N_2$ gas near the interface of an irradiation region of the crystal layer to be separated from the substrate. This makes it possible to prevent an excess stress from being applied to the crystal layer and hence to reduce occurrence of cracks in the crystal layer. In addition to the above advantage, according to this embodiment, there can be obtained several additional advantages. One of these advantages is that since the line width of the line-shaped laser beam is reduced, it is possible to enhance the irradiation energy density of the laser beam. Another advantage is that since the length (longitudinal size) of the line-shaped laser beam can be made longer, it is possible to enlarge the light intensity over the threshold value required for decomposition of the crystal layer in the longitudinal direction of the laser beam, and hence to separate the crystal layer with a good throughput.

Figure 5:
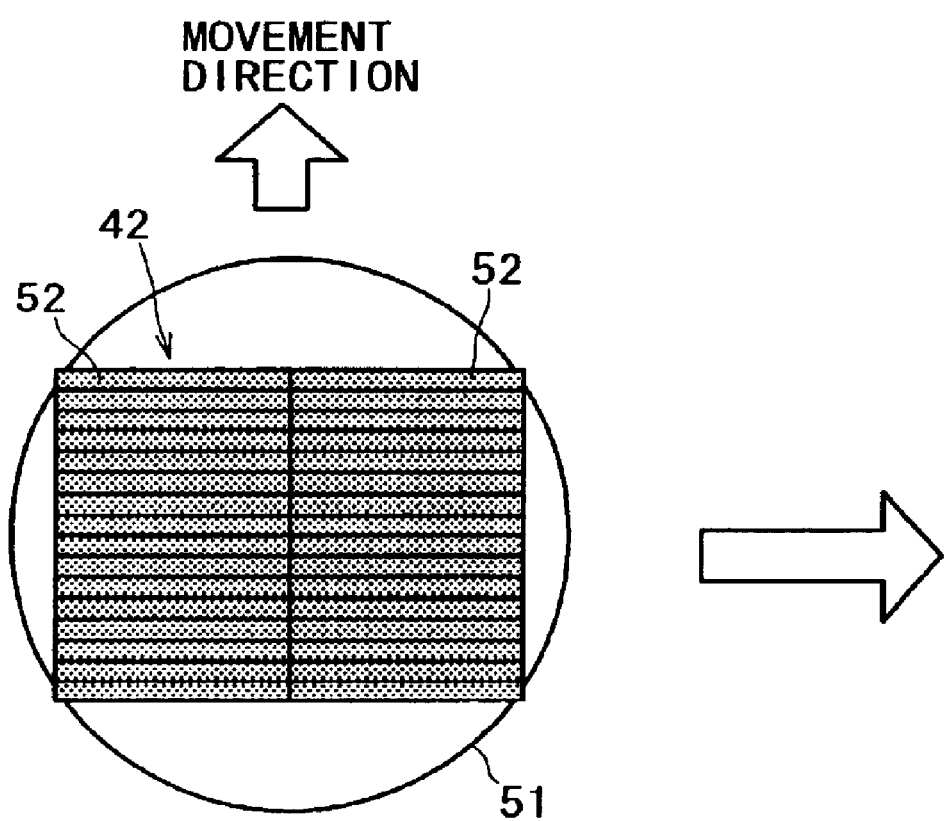
FIG. 5 is a plan view of the sample in the experiment for examining the effect of the crystal layer separation method of the present invention.

An experiment, which has made by the present inventor to compare a crack generation state of the crystal layer irradiated by the laser irradiation method according to this embodiment with that according to the related art method, will be described with reference to FIGS. 4 to 6B. FIGS. 4 and 5 are a sectional view and a plan view showing a state that a plurality of devices formed on a substrate via a crystal layer are separated, together with the crystal layer, from the substrate by irradiating the interface between the crystal layer and the substrate with a laser beam from the back surface of the substrate, respectively.

Referring to FIG. 4, a GaN layer 42 (crystal layer of a GaN based compound) is formed on a sapphire substrate 41, and a plurality of pyramid shaped light emitting diodes 43 are formed on the GaN layer 42, and then, the interface between the sapphire substrate 41 and the GaN layer 42 is irradiated with a line-shaped excimer laser beam 44 from the back surface of the sapphire substrate 41, to separate the GaN layer 42 integrated with the light emitting diodes 43 from the sapphire substrate 41. In this case, before being separated from the sapphire substrate 41, the GaN layer 42 is fixed to a transfer substrate 48 via a resin layer 47. The resin layer 47 is composed of a polyimide layer 45 and an adhesive layer 46. The adhesive layer 46 is bonded to the transfer substrate 48, and sharp tips of the light emitting devices 43 are pierced in the resin layer 47 until the whole light emitting devices 43 are buried in the resin layer 47. As a result, the GaN layer 42 integrated with the light emitting devices 43 is fixed to the transfer substrate 48 via the resin layer 47. After that, the GaN layer 42 integrated with the light emitting devices 43 is separated from the sapphire substrate 41 by irradiating the interface between the GaN layer 42 and the sapphire substrate 41 with the line-shaped laser beam from the back surface of the sapphire substrate 41.

The separation plane of the GaN layer 42 in the state after the GaN layer 42 fixed to the transfer substrate 48 via the resin layer 47 is separated from the sapphire substrate 41 is shown in FIG. 5. The GaN layer 42 has been sequentially irradiated with the line-shaped laser beam while the transfer substrate 48 (not shown in this figure) fixed to a stage 51 is moved in the movement direction shown in the figure. In the laser irradiation, the laser beam, which is a pulse laser, is sequentially projected, to form an irradiation region 52 per one shot (one pulse) of the laser beam. In addition, the sapphire substrate 41 is not shown in the figure.

Figure 6B:
Figure 6A:
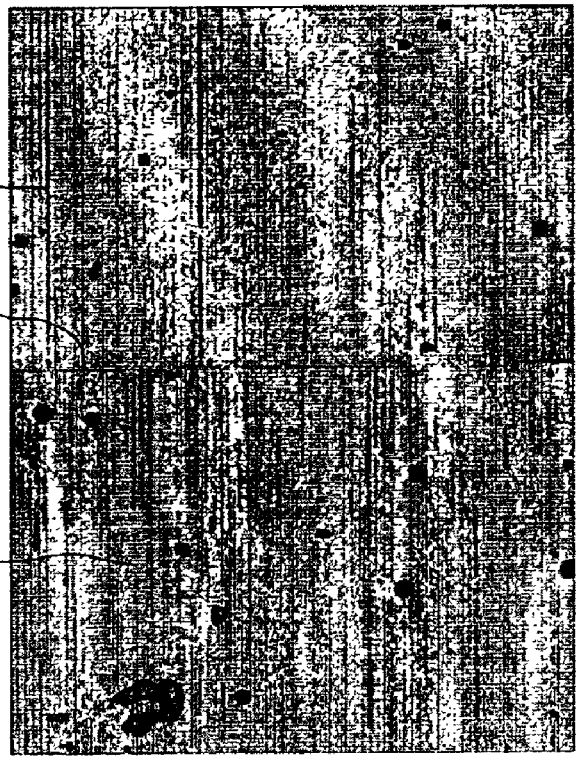

The experimental results are shown in FIGS. 6A and 6B. FIG. 6A is a microphotograph showing a crack generation state of the GaN layer 42 irradiated with the laser beam having a reduced line width according to the method of the present invention, and FIG. 6B is a microphotograph showing a crack generation state of the GaN layer 42 irradiated with the laser beam having a non-reduced line width according to the related art method. The longitudinal direction of the laser beam 44 irradiating the GaN layer is the horizontal direction of the microphotograph, and the GaN layer 42 is irradiated with the laser beam 44 while being moved in the direction in the vertical direction in the microphotograph. In this experiment for comparison of the crack generation state between the method of the present invention and the related art method, the GaN layer (thickness: 3 $\mu$m) grown on the sapphire substrate 41 is irradiated with a KrF excimer laser beam (energy density: 400 mJ/cm$^2$, m=3) under the following irradiation condition.

TABLE

|  |  | (a) non-reduced line width (related art) | (b) reduced line width (present invention) |
|---|---|---|---|
| size of line-shaped laser beam | length (mm) width ($\mu$m) | 2.0 20 | 2.0 10 |
| scanning pitch ($\mu$m/pulse) |  | 16 | 2 |
| number of shots (pulses/sec) |  | 20 | 160 |

As shown in FIGS. 6A and 6B, in the laser irradiation under the irradiation condition (a) according to the related art, a large number of cracks 61 extending in the horizontal direction are observed in the microphotograph (see FIG. 6A), while in the laser irradiation under the irradiation condition (b) according to the present invention, cracks are little observed in the microphotograph (see FIG. 6B). As a result, it becomes apparent that it is possible to suppress the occurrence of cracks in the GaN layer by reducing the line width of the line-shaped laser beam 44 used for laser irradiation of the GaN layer. In addition, as shown in FIG. 6A, a crack 62 extending in the vertical direction occurs along a linear area at which the two pulses of the line-shaped laser beam 44 are overlapped to each other in the horizontal direction. As a result, it becomes apparent that a crack occurs in an area at which the two pulses of the laser beam 44 are overlapped to each other.

The experimental result also shows that even if the line width of the laser beam per one shot is reduced, the entire region of the GaN layer 42 can be irradiated with the laser beam with a good throughput by increasing the number of shots per unit time of the laser beam while reducing the line width (scanning pitch).

It is to be noted that although the crystal axis of the crystal layer to be separated is not taken into account at the time of selecting the longitudinal direction and the scanning direction of the laser beam used for laser irradiation of the crystal layer in this embodiment, it may be preferred to select the longitudinal direction and the scanning direction of the laser beam in such a manner that such a direction is aligned to the cleavage direction along the crystal axis of the crystal layer.

An embodiment of the method of fabricating devices using the above-described crystal layer separation method and the laser irradiation method will be hereinafter described with reference to FIGS. 7 to 19. In this embodiment, the fabrication method of the present invention is applied as one example to a method of fabricating light emitting devices on a crystal layer made from a GaN based compound. Referring to first to FIG. 7, a first growth layer 72 is formed on a growth substrate 71. As the growth substrate 71, any kind of substrate may be used insofar as it allows a wurtzite type compound semiconductor layer to be grown thereon. For example, a sapphire substrate with a C-plane of sapphire taken as a principal plane of the substrate, which has been often used for growth of GaN (gallium nitride) based compound semiconductors, is preferably used. It is to be noted that in the case of using a sapphire substrate with a C-plane of sapphire taken as a principal plane of the substrate, the C-plane may be an approximately C-plane tilted from the C-plane within a range of 5 to 6°.

The first growth layer 72 formed on the principal plane of the growth substrate 71 is preferably made from a wurtzite type compound semiconductor. This is because the first growth layer 72 made from a wurtzite type compound semiconductor is suitable as an underlying layer for allowing a hexagonal pyramid structure to be formed thereon in the subsequent step. Examples of the wurtzite type compound semiconductors as the materials for forming the first growth layer 72 may include a group III based compound semiconductor, and a group III-V based compound semiconductor such as a GaN (gallium nitride) based compound semiconductor, an InGaN (indium gallium nitride) based compound semiconductor, and an AlGaN (aluminum gallium nitride) based compound semiconductor.

The first growth layer 72 may be formed by a vapor-phase growth process, examples of which include an MOCVD (Metalorganic Chemical Vapor deposition) or MOVPE (Metalorganic Vapor Phase Epitaxy) process, an MBE (Molecular Beam Epitaxy) process, and an HVPE (Hydride Vapor Phase Epitaxy) process. In particular, the MOCVD process is preferable because it allows rapid formation of the first growth layer 72 with good crystallinity.

The first growth layer 72 is actually formed by stacking an undoped first growth layer 72a and a silicon-doped first growth layer 72b. In general, since the first growth layer 72 functions as a conductive layer to be connected to an n-side electrode, an impurity such as silicon is doped in the whole of the first growth layer 72. According to this embodiment, however, as will be described later, after device isolation grooves having a depth reaching a half of the thickness of the first growth layer 72 is formed in the whole semiconductor growth layer on the growth substrate 71, the whole semiconductor growth layer is held on a temporarily holding substrate and separated from the growth substrate 71 by laser ablation from the back surface side of the growth substrate 71, to be transferred to the temporarily holding substrate, and the back surface side of the whole semiconductor growth layer is partially removed to a depth reaching the device isolation grooves. Accordingly, the first growth layer 72a, which is the lowermost layer of the whole semiconductor growth layer, that is, the layer to be removed in the subsequent step, is not required to be doped with any impurity. Further, according to this embodiment, as will be described later, since the first growth layer 72 made from a GaN based compound can be separated from the growth substrate 71 in a state that cracks little occur in the first growth layer 72, only the first growth layer 72b doped with silicon or the like may be directly grown on the growth substrate 71 without growth of the underlying first growth layer 72a.

Referring to FIG. 8, after the first growth layer 72 is formed by sequentially stacking the undoped first growth layer 72a and the silicon-doped first growth layer 72b, an anti-growth film 73 made from silicon oxide or silicon nitride is formed overall on the first growth layer 72. The anti-growth film 73 is used as a mask layer, and is formed on the first growth layer 72 by a sputtering process or the like.

Figure 9:
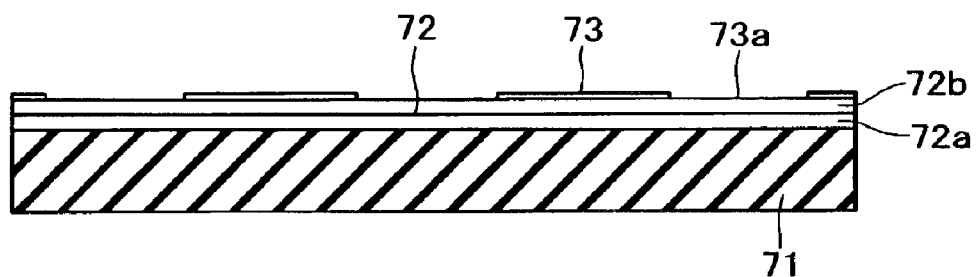
FIG. 9 is a sectional view showing a step of forming opening portions in the embodiment of the method of fabricating devices according to the present invention.

Referring to FIG. 9, after the anti-growth film 73 functioning as the mask is formed overall on the first growth layer 72, the anti-growth film 73 is partially removed, to form opening portions 73a. The shape of each opening portion 73a is not particularly limited insofar as it allows a second growth layer (to be described later) having planes tilted from the principal plane of the substrate to be selectively grown from the opening portion 73a. Examples of the shapes of the opening portions 73a include a stripe shape, a rectangular shape, a circular shape, an elliptic shape, a triangular shape, and a polygonal shape such as a hexagonal shape. The surface of a portion, exposed from the opening portion 73a, of the first growth layer 72 has the same shape as that of the opening portion 73a.

Figure 10:
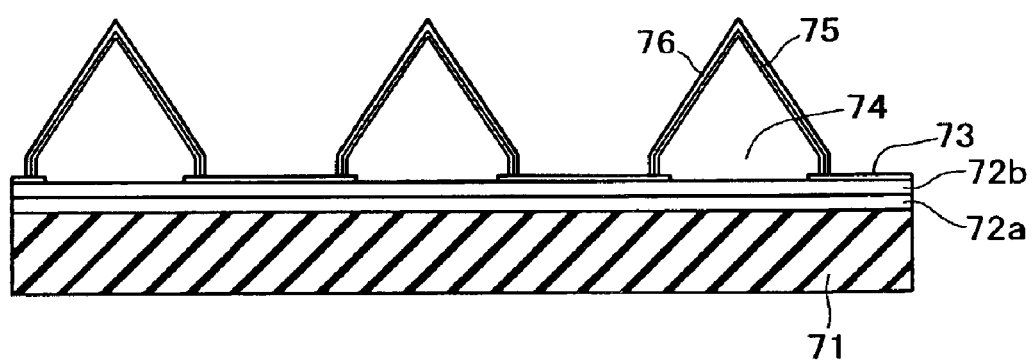
FIG. 10 is a sectional view showing a step of forming a first conductive layer, an active layer, and a second conductive layer in the embodiment of the method of fabricating devices according to the present invention.

Referring to FIG. 10, after the opening portions 73a having the specific shapes are formed in the anti-growth film 73, a second growth layer composed of a first conductive layer 74, an active layer 75, and a second conductive layer 76 is formed by selective growth from the opening portions 73a.

The first conductive layer 74 is made from a wurtzite type compound semiconductor similar to that used for forming the first growth layer 72, for example, silicon-doped GaN. The first conductive layer 74 functions as an n-type cladding layer. In the case where the growth substrate 71 is a sapphire substrate with the C-plane of sapphire taken as the principal plane of the substrate, the first conductive layer 74 is selectively grown into a hexagonal shape having an approximately triangular cross-section.

The active layer 75 functions as a light emitting layer of the light emitting device, and has a single structure of an InGaN layer or a stacked structure of an InGaN layer sandwiched between AlGaN layers. The active layer 75 extends along a facet structure composed of the tilt planes of the first conductive layer 74, and has a thickness suitable for light emission.

The second conductive layer 76 is made from a wurtzite type compound such as magnesium-doped GaN. The second conductive layer 76 functions as a p-type cladding layer. The second conductive layer 76 also extends along the facet structure composed of the tilt planes of the first conductive layer 74, and has a thickness suitable for light emission. The tilt planes of the hexagonal shape formed by selective growth are selected from S-planes (1-101) and (11-22), and planes substantially equivalent thereto.

FIGS. 11 and 12 show a step of forming device isolation grooves 78. Referring to FIG. 11, to prevent the second conductive layer 76 formed on the outermost side from being eroded by etching performed for forming the device isolation grooves 78, the second conductive layer 76 and the first growth layer 72 covered with the anti-growth film 73 are covered overall with a protective film 77. The protective film 77 is typically a silicon oxide film formed by a plasma CVD process. Referring to FIG. 12, after the protective film 77 is formed, the device isolation grooves 78 are formed by reactive ion etching or the like, to isolate device regions from each other.

The device isolation grooves 78 have a depth reaching a half of the thickness of the first growth layer 72, that is, a depth reaching the undoped first growth layer 72a. As a result, even at the time of separating the whole semiconductor growth layer from the growth substrate 71, the whole semiconductor growth layer can be kept as one body by means of the first growth layer 72a. In this case, since the whole semiconductor growth layer kept as one body has a sufficiently large size as compared with the size of each of micro-sized devices, it is possible to reduce the occurrence of cracks in the semiconductor devices at the time of separating the whole semiconductor growth layer from the growth substrate 71.

Figure 13:
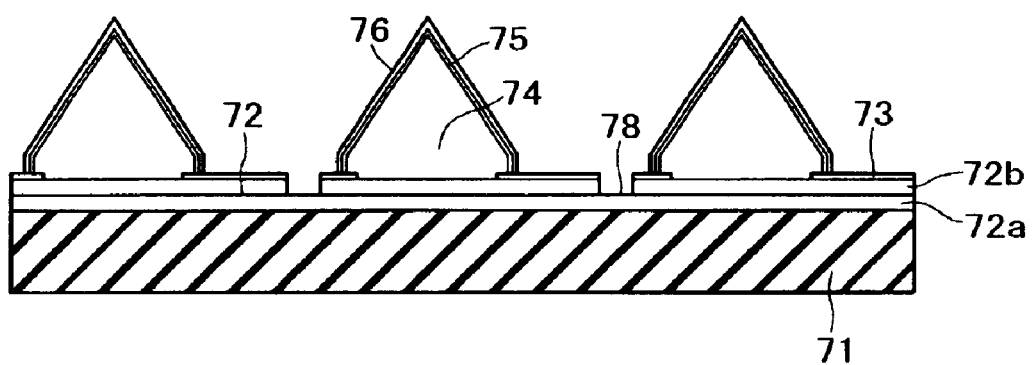
FIG. 13 is a sectional view showing a step of removing the protective film in the embodiment of the method of fabricating devices according to the present invention.
Figure 14:
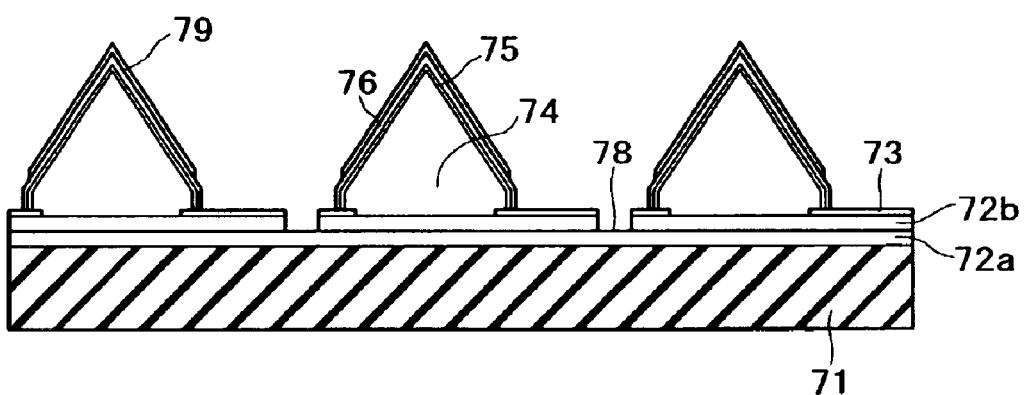
FIG. 14 is a sectional view showing a step of forming a p-side electrode in the embodiment of the method of fabricating devices according to the present invention.

Referring to FIG. 13, after the device isolation grooves 78 are formed, the protective film 77 is removed by using acid or the like. Referring to FIG. 14, after the protective film 77 is removed, for each of the semiconductor devices, a p-side electrode 79 is formed on the surface of the second conductive layer 76 as the outermost layer of the hexagonal pyramid shaped second growth layer. The p-side electrode 79 typically has an Ni/Pt/Au electrode structure or a Pd/Pt/Au electrode structure formed by a vapor-deposition process of the like. It is to be noted that an n-side electrode to be formed on the bottom of each of the semiconductor devices is not formed in this step.

Referring to FIG. 15, the whole semiconductor growth layer is fixed to an adhesive layer 80 bonded to a temporarily holding substrate 81. The adhesive layer 80 is made from wax or a synthetic resin. Referring to FIG. 16, the interface between the lowermost first growth layer 72a of the semiconductor growth layer and the growth substrate 71 is irradiated with an excimer laser beam L having a wavelength in an ultraviolet region from the back surface of the growth substrate 71, to cause laser ablation at the interface therebetween, whereby the whole semiconductor growth layer is separated from the growth substrate 71 and is transferred to the temporarily holding substrate 81. At this time, the laser beam L shaped into a line-pattern is sequentially projected as a pulse beam to the back surface side of the growth substrate 71.

The laser irradiation performed in the above separation step will be more fully described. According to the embodiment of the fabrication method of the present invention, the laser beam L is shaped into a line width equal to or less than a resolution of an optical system for projecting the laser beam L before the laser beam L is projected to irradiate the interface between the first growth layer 72a and the growth substrate 71. Further, according to this embodiment of the fabrication method, with respect to the irradiation region, irradiated with the laser beam L, at the interface between the first growth layer 72a and the growth substrate 71, the width of an unit irradiation region by one shot of the laser beam L is set to a value equal to or less than the thickness of the first growth layer 72a. With this configuration, since the line width of the laser beam L is set to a value equal to or less than the resolution of the optical system, the laser beam L has a light intensity distribution in which the light intensity is smoothly changed from a peak portion to an edge portion. Accordingly, at the time of irradiating the interface between the first growth layer 72a and the growth substrate 71 with the laser beam L, the laser ablation is not rapidly performed at an edge portion, equivalent to the edge portion of the laser beam in the line width direction, of the irradiation region. As a result, N₂ gas is not rapidly generated at the time of decomposition of the first growth layer 72a as the GaN layer, and thereby an excess stress is not applied to the first growth layer 72a. This makes it possible to reduce occurrence of cracks in the first growth layer 72a and the semiconductor devices formed thereon. The GaN (gallium nitride) based semiconductor forming the first growth layer 72a is decomposed into gallium and nitrogen at the interface between the first growth layer 72a and the growth substrate 71 by sequentially irradiating the interface therebetween with the line-shaped laser beam L. As a result, the whole semiconductor growth layer can be relatively simply separated from the growth substrate 71 at the interface between the first growth layer 72a and the growth substrate 71.

At this time, since the device isolation grooves 78 have the depth reaching a half of the first growth layer 72, that is, the undoped first growth layer 72a, the whole semiconductor growth layer can be kept as one body by means of the undoped first growth layer 72a even at the time of separating the whole semiconductor growth layer from the growth substrate 71. Accordingly, the undoped first growth layer 72a, which keeps the whole semiconductor growth layer as one body, prevents the laser beam L, projected to the back surface of the growth substrate 71 for separating the whole semiconductor growth layer from the growth substrate 71 by laser ablation, from reaching the adhesive layer 80 for holding the whole semiconductor growth layer. As a result, at the time of separating the whole semiconductor layer from the growth substrate 71, the adhesive layer 80 is prevented from being ablated by the laser beam L. Accordingly, the whole semiconductor growth layer, that is, the semiconductor devices can be desirably held on the temporarily holding substrate 81 via the adhesive layer 80.

Referring to FIG. 17, the first growth layer 72a is removed by etching from the back surface of the whole semiconductor growth layer transferred to the temporarily holding substrate 81, to isolate the whole semiconductor growth layer into the devices as shown in FIG. 18. To be more specific, since the device isolation grooves 78 pass through the upper first growth layer 72b of the first growth layer 72, to reach the lower first growth layer 72a of the first growth layer 72, the whole semiconductor growth layer is isolated into the semiconductor devices by removing the first growth layer 72a by etching from the back surface side of the whole semiconductor growth layer.

In the case of forming, after isolating layer portions forming semiconductor devices from each other, an n-side electrode on the back surface of each of the layer portions, since the back surface side of the layer portion has a poor crystallinity, such a back surface side is generally removed. According to this embodiment, however, since the device isolation grooves 78 have the depth reaching the undoped first growth layer 72a and the first growth layer 72a is removed for isolating the whole semiconductor layer on the sapphire substrate 71 into the semiconductor devices, the portion, having a poor crystallinity, near the interface with the sapphire substrate 71 can be removed simultaneously with the separation of the whole semiconductor growth layer into the semiconductor devices. As a result, an n-side electrode 82 can be efficiently formed on the back surface of each of the semiconductor devices thus isolated from each other.

Figure 19:
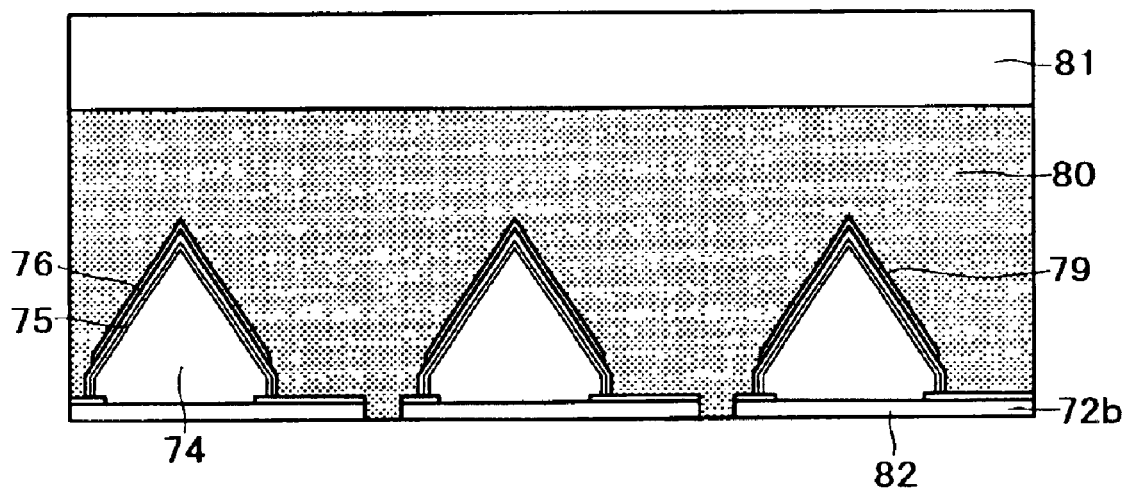
FIG. 19 is a sectional view showing a step of forming an n-type electrode in the embodiment of the method of fabricating devices according to the present invention.
Figure 20:
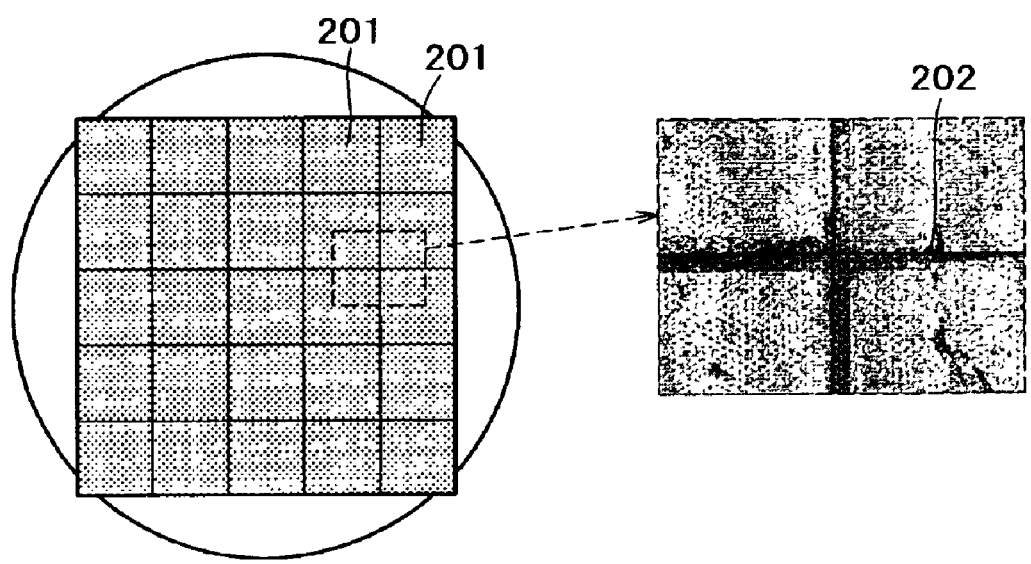
FIG. 20 is a view showing a state that cracks occur in a crystal layer in a related art crystal layer separation method.

Referring to FIG. 19, the n-side electrode 82 is formed on the back surface of each of the semiconductor devices isolated from each other. The n-side electrode 82 typically has a Ti/Al/Pt/Au electrode structure formed by the vapor-deposition process or the like. Alternatively, the n-side electrode 82 may be configured as a transparent electrode made from ITO. In the case of using the transparent electrode as the n-side electrode 82, even if the transparent electrode covers the whole of the back surface of each of the semiconductor devices, the electrode does not shield light emitted from the semiconductor device, more specifically, the light emitting device.

The fabrication method of the present invention configured as described above has the following advantages:

Since the device isolation grooves 78 formed in the whole semiconductor growth layer on the sapphire substrate 71 have the depth reaching a half of the first growth layer 72, that is, the depth reaching the undoped first growth layer 72a, the whole semiconductor growth layer can be kept as one body by means of the first growth layer 72a even at the time of separating the whole semiconductor growth layer from the sapphire substrate 71 by laser ablation. In this case, the whole semiconductor growth layer kept as one body has a sufficiently large size relative to each of micro-sized devices to be formed by the whole semiconductor growth layer, it is possible to reduce cracks in the whole semiconductor growth layer occurring at the time of separating the whole semiconductor growth layer from the sapphire substrate 71, with a result that the whole semiconductor growth layer can be simply separated from the sapphire substrate 71.

Since the interface between the first growth layer 72a made from a GaN based compound and the growth substrate 71 is irradiated with the line-shaped laser beam, it is possible to reduce cracks occurring at the time of laser ablation. At this time, as described above, the line width of the laser beam is set to a value equal to or less than the thickness of the first growth layer 72a made from GaN.

Since the whole semiconductor growth layer is kept as one body by means of the first growth layer 72a at the time of separating the whole semiconductor growth layer from the sapphire substrate 71 by laser ablation, the whole semiconductor growth layer kept as one body prevents the laser beam, projected to the back surface of the sapphire substrate 71 for separating the whole semiconductor growth layer from the sapphire substrate 71 by laser ablation, from reaching the adhesive layer 80 formed for transferring the whole semiconductor growth layer to the temporarily holding substrate 81. As a result, it is possible to prevent the adhesive layer 80 from being ablated from the laser beam, and hence to desirably hold the semiconductor devices on the temporarily holding substrate 81.

In the case of separating, after isolating the whole semiconductor growth layer into the micro-sized devices, the whole semiconductor growth layer from the sapphire substrate 71, since the first growth layer 72a as an underlying layer for supporting the devices has only the thickness of the order of several $\mu m$ and thereby has a low mechanical strength, the laser ablation is made by using the laser beam having the line width equal to or less than the thickness of the first growth layer 72a, with a result that it is possible to prevent occurrence of cracks in the first growth layer 72a at the time of laser ablation.

To form the n-side electrode on the back surface, with a poor crystallinity, of each of the semiconductor devices isolated from each other, the back surface of the semiconductor device must be removed. According to this embodiment, however, since the whole semiconductor growth layer on the sapphire substrate 71 is removed from the back surface side by a thickness reaching the device isolation grooves 78 to isolate the whole semiconductor growth layer into the semiconductor devices, the back surface side, with a poor crystallinity, near the interface with the sapphire substrate can be removed simultaneously with the separation of the whole semiconductor growth layer into the devices. As a result, the n-side electrode 82 can be efficiently formed on the back surface of each of the semiconductor devices thus isolated from each other.

In this way, according to the crystal layer separation method, the laser irradiation method, and the method of fabricating devices using the same according to the present invention, a crystal layer formed on a substrate can be separated from the substrate in a state that cracks little occur in the crystal layer. In particular, even if the thickness of the crystal layer is as small as several μm for forming micro-sized devices thereon and thereby has a low mechanical strength, cracks little occur in the crystal layer. As a result, in the case of forming micro-sized devices on a crystal layer, the devices are little damaged, and accordingly, it is possible to fabricate micro-sized devices at a high yield.

Further, according to the present invention, the whole surface of a crystal layer can be subjected to laser ablation by sequentially irradiating the whole surface of the crystal layer with a line-shaped laser beam as a pulse beam, to separate the crystal layer from a substrate with a high throughput by optimizing the pulse, interval and the movement speed of the crystal layer. This is effective to improve the process of fabricating devices. In addition, it is possible to make effective use of the energy of the laser beam for laser ablation by reducing the line width of the line-shaped laser beam.

While the preferred embodiments of the present invention have been described using the specific terms, such description is for illustrative purposes only, and it is to be understood that changes and variations may be made without departing from the spirit or scope of the following claims.

What is claimed is:

1. A crystal layer separation method comprising a step of:
    separating a crystal layer formed on a substrate from said substrate by irradiating said crystal layer with light;
    wherein said crystal layer is irradiated with said light in a line-shape to simultaneously irradiate a line-shaped irradiation region of the crystal layer having a greater dimension in a longitudinal direction than in a width direction.

2. A crystal layer separation method according to claim 1, wherein an irradiation width of said light is equal to or less than a thickness of said crystal layer.

3. A crystal layer separation method according to claim 1, wherein said crystal layer is irradiated with said light while being moved.

4. A crystal layer separation method according to claim 3, wherein said crystal layer is moved in a direction substantially perpendicular to a longitudinal direction of said light.

5. A crystal layer separation method according to claim 1, wherein said light is pulse light.

6. A crystal layer separation method according to claim 1, wherein said substrate is a sapphire substrate.

7. A crystal layer separation method according to claim 1, wherein said crystal layer is made from a GaN compound.

8. A crystal layer separation method according to claim 1, wherein said light is a laser beam.

9. A crystal layer separation method according to claim 8, wherein said laser beam has a light intensity distribution smoothened in a width direction.

10. A crystal layer separation method according to claim 8, wherein said laser beam is an excimer laser beam.

11. A crystal layer separation method according to claim 1, wherein devices are formed on said crystal layer.

12. A crystal layer separation method according to claim 1, wherein said crystal layer is irradiated with said light from a back surface of said substrate.

13. A laser beam irradiation method comprising a step of:
    irradiating a target with a laser beam in a line-shape to simultaneously irradiate a line-shaped irradiation region having a greater dimension in a longitudinal direction than in a width direction;
    wherein said laser beam has a smooth light intensity distribution in the width direction.

14. A laser beam irradiation method according to claim 13, wherein said light intensity distribution of said laser beam has a smooth edge portion.

15. A laser beam irradiation method according to claim 13, wherein an irradiation width of said laser beam is smaller than a resolution of an optical system for projecting said laser beam.

16. A device fabrication method comprising a step of:
    irradiating a crystal layer formed on a substrate with light in a line-shape to simultaneously irradiate a line-shaped irradiation region of the crystal layer having a greater dimension in a longitudinal direction than in a width direction, thereby separating said crystal layer from said substrate.

17. A device fabrication method according to claim 16, wherein an irradiation width of said light is equal to or less than a thickness of said crystal layer.

18. A device fabrication method according to claim 16, wherein said substrate is a sapphire substrate.

19. A device fabrication method according to claim 16, wherein said crystal layer is made from a GaN-based compound.

20. A device fabrication method according to claim 16, wherein a crystal layer having an S-plane (1-101) is formed on said crystal layer.

* * * * *